(12) United States Patent  
Besse et al.

(10) Patent No.: US 8,456,783 B2  
(45) Date of Patent: Jun. 4, 2013

(54) INTEGRATED CIRCUIT, ELECTRONIC DEVICE AND ESD PROTECTION THEREFOR

(75) Inventors: Patrice Besse, Toulouse (FR); Erwan Hemon, Goyrans (FR); Philippe Lance, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 792 days.

(21) Appl. No.: 12/597,006

(22) PCT Filed: Apr. 27, 2007

(86) PCT No.: PCT/IB2007/052684

§ 371 (c)(1),
(2), (4) Date: Oct. 22, 2009

(87) PCT Pub. No.: WO2008/132561

PCT Pub. Date: Nov. 6, 2008

(65) Prior Publication Data

US 2010/0128402 A1      May 27, 2010

(51) Int. Cl.
*H02H 9/00*         (2006.01)

(52) U.S. Cl.
USPC .......................................................... 361/56

(58) Field of Classification Search
USPC .......................................................... 361/56
See application file for complete search history.

(56) References Cited

U.S. PATENT DOCUMENTS

| | | | |
|---|---|---|---|
| 5,751,525 A * | 5/1998 | Olney | 361/56 |
| 6,198,136 B1 * | 3/2001 | Voldman et al. | 257/357 |
| 6,770,938 B1 | 8/2004 | Fliesler et al. | |
| 6,970,336 B2 | 11/2005 | Stockinger et al. | |
| 2002/0131220 A1 | 9/2002 | Li | |
| 2004/0136126 A1 | 7/2004 | Smith | |
| 2006/0152870 A1 | 7/2006 | Chen et al. | |
| 2007/0029646 A1 * | 2/2007 | Voldman | 257/662 |
| 2010/0232079 A1 * | 9/2010 | Wu et al. | 361/56 |
| 2011/0079912 A1 * | 4/2011 | Marcoux | 257/773 |
| 2011/0216455 A1 * | 9/2011 | Igarashi | 361/56 |

OTHER PUBLICATIONS

Voldman S H et al: "Analysis of Snubber-Clamped Diode-String Mixed Voltage Interface ESD Protection Network for Advanced Microprocessors" Journal of Electrostatics, Elsevier Science Publishers B.V. Amsterdam, NL, vol. 38, No. 1-2, Oct. 1996.
International Search Report and Written Opinion correlating to PCT/IB2007/052684 dated Dec. 3, 2007.

* cited by examiner

*Primary Examiner* — Ronald W Leja

(57) ABSTRACT

An integrated circuit comprises electro-static discharge (ESD) protection circuitry arranged to provide ESD protection to one or more external connector(s) of the integrated circuit. The ESD protection circuitry comprises at least one ESD protection component coupled to the one or more external connectors for providing ESD protection thereto. The ESD protection circuitry further comprises an ESD connector coupled to the one or more external connector(s), arranged to couple supplementary ESD protection to the one or more external connector(s).

20 Claims, 3 Drawing Sheets

INTEGRATED CIRCUIT, ELECTRONIC DEVICE AND ESD PROTECTION THEREFOR

TECHNICAL FIELD

The field of this invention relates to an integrated circuit, electronic device and electro-static discharge (ESD) protection therefor.

BACKGROUND

It is well known in the field of integrated circuit (IC) design and manufacture to provide protection to IC packages against electro-static discharge (ESD) events. ESD events are occurrences of high electrical potentials of limited energy that can cause damage to IC components.

FIG. 1 illustrates an example of a known centralised ESD protection circuit 110 for an IC 100, and which forms an integrated part of the IC package.

The IC 100 comprises functional circuitry 120, providing the functionality for which the IC is intended, and for which ESD protection is required. The ESD protection circuitry 110 comprises an internal ESD clamp 130, coupled to the functional circuitry 120 via isolation diodes 140. In this manner, current arising from an ESD event flows through one or more of the isolation diodes 140, into the ESD clamp 130, which absorbs the initial ESD surge to protect the functional circuitry 120 from a current spike, and then dissipates the ESD event energy safely. The isolation diodes 140 enable an electrical isolation to be provided between each pin to be protected.

Such centralised ESD protection circuitry 130, often referred to as a rail clamp, is suitable for digital applications, for example CMOS technologies. For such digital applications, ESD requirements are defined by testing standards, such as: the Jedec standard JESD 22-A11D ESD Sensitivity Testing Human Body Model (HBM); and Jedec standard JESD22_C101C Field-Induced Charged-Device Model test Method for Electrostatic-Discharge-Withstand Thresholds of Microelectronic Components (CDM).

The purpose of HBM testing is to reproduce the EDS event that a human being could create when coming into contact with the IC. In general, the test requires the EDS protection circuitry to protect against a peak current of 2.6 Amps.

The purpose of CDM testing is to reproduce the ESD event experienced by an IC initially charged and then subsequently discharged to ground through one pin. The CDM ESD peak current is around 3 Amps.

However, for analogue applications, and in particular for analogue applications requiring a high standard of reliability, ESD protection circuitry is required to provide protection against significantly higher ESD peak currents. Examples of such applications include, by way of example, automotive systems, such as anti-lock brake systems (ABS), airbag deployment systems, electronic stabilisation program (ESP) systems, etc.

For such applications requiring a high standard of reliability, it is known for circuitry to be subjected to ESD gun testing, such as that defined in IEC6100042, ISO10605, etc. In such testing, an ESD is generated by a 'gun', and applied to the pins of an IC under test. The ESD gun may be charged up to 25 kVolts prior to being discharged through a resistor of 330 Ohms or 2 Kohms, depending upon the specification. Thus, the current peak can reach 90 Amps, which is significantly higher than that of HBM and CDM testing.

As will be appreciated by a skilled artisan, in order for ESD protection circuitry, for example known ESD circuitry 120 illustrated in FIG. 1, to protect against such a high current peak, the ESD clamp 130 is required to comprise a significant capacitance in order to be able to absorb the current. Furthermore, the isolation diodes would have to be able to sustain up to 90 Amps. This inherently increases the size and cost of the ESD clamp 130 and the isolation diodes 140, and thus the amount of space they take up within the IC 100, and thereby overall cost of the IC 100.

In such a case, the ESD protection circuitry may require up to around ten percent of the area of the IC. This has a direct impact on the size and the cost of the components, which in turn affects both the cost of the IC package, and the required footprint for the IC package on a printed circuit board or the like. This is particularly significant as technology advances, since the ESD protection circuitry is incapable of a reduction in size in line with that of the functional circuitry of the IC.

A further problem that has been identified with the prior art ESD protection is that, due to layout constraints of circuitry within an IC package, it is generally the case that a centralised ESD clamp may not be placed close to the isolation diodes. The resistance of metal traces connecting the isolation diodes and the ESD clamp is low, but not negligible (e.g. 0.2 Ohms to 1 Ohm), and increases with a length of the metal traces.

As will be appreciated by a skilled artisan, during an ESD gun test, the relatively high peak currents involved in the test result in significant voltage drops, across even the smallest resistances. For example, in the case of an ESD gun test comprising a 60 Amp peak current, if a metal trace is sufficiently long to comprise a resistance to 1 Ohm, the voltage drop across the metal trace will be 60 volts, which can exceed the voltage capability of the ESD protection circuitry, which may be, for example, only 45 Volts. Consequently, the length of the metal traces between the isolation diodes and the ESD clamp on the one side, and on the other side the metal traces between the ESD clamp and the ground pin, affects the ability of the ESD protection circuitry to adequately protect an IC. The resistance of a metal trace depends on its geometry aspect (length/width). It is often the case that, in order to reach a sufficiently low resistance value, the trace is required to comprise a shorter length and a greater width than can be achieved within an integrated circuit.

Alternative known methods of providing ESD protection comprise those pins to be protected being tied to power rails via diodes. In this way, a decoupling capacitor of the power supply provides some ESD protection. However, the pins must be compatible with the power supply rating (e.g. 0.6V), and the decoupling capacitor of the power supply generally is insufficient for high levels of ESD protection, such as those required in ESD gun testing.

In order to provide adequate ESD protection without incurring significant size and cost increases to an IC packages, using prior art ESD protection methods, connection pins of an IC package are required to be individually protected. In this manner, external ESD protection devices are provided individually on sensitive pins. Although this may save on the size and cost of the IC itself, the cost, both in terms of financial cost and space requirements, is simply passed on to the printed circuit board on which the IC is mounted. Indeed, as pins are protected individually, a plurality of ESD protection components are required, thereby significantly increasing the cost and required area for ESD protection.

The requirements of ESD gun testing are increasing, in particular with regard to the peak currents required to be protected against. In 2004, ESD gun testing required a 30 Amp peak current to be protected against. This increased to a peak current of 60 Amps in 2006. In 2007, the peak current required to be protected against has increased to 90 Amps.

These significant increases in the required protection of ESD protection circuitry, along with the increasing demands for reduction in both size and cost of ICs, exacerbates the short comings of known ESD protection techniques.

Thus, there exists a need for improved ESD protection for integrated circuits.

SUMMARY OF INVENTION

In accordance with aspects of the invention, there is provided an electronic device, and an integrated circuit, as defined in the appended Claims.

Figure 1:
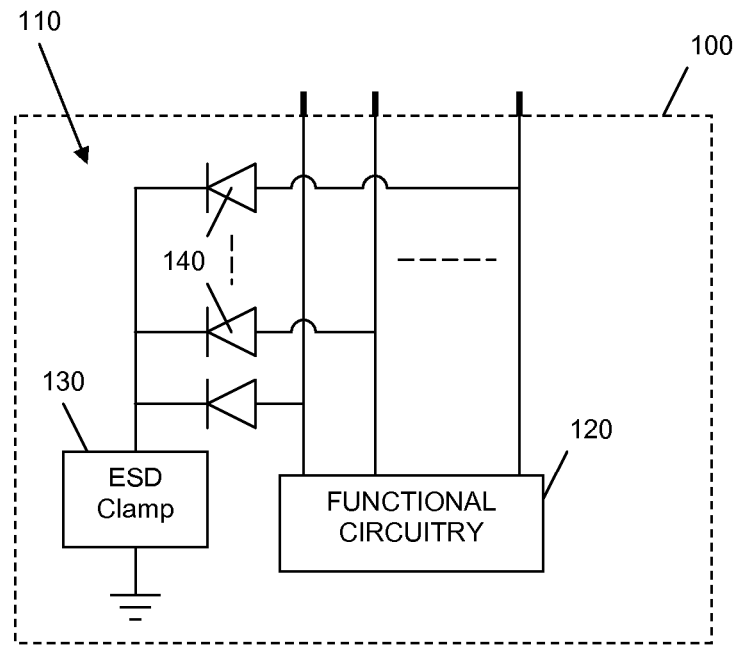
FIG. 1 illustrates an example of a known centralised electro-static discharge protection circuit.
Figure 2:
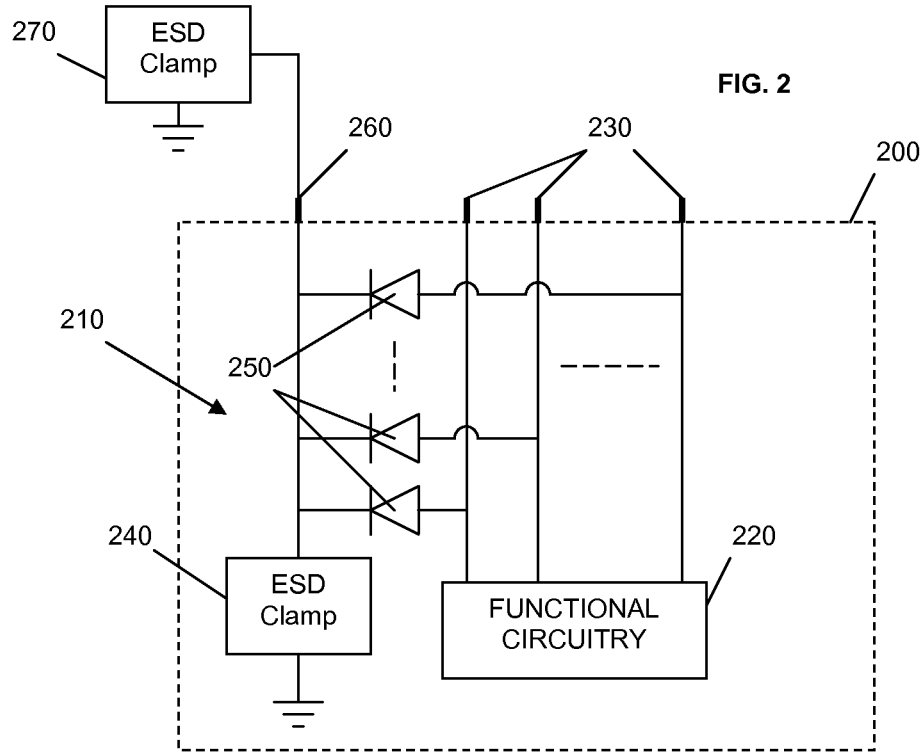

Exemplary embodiments of the invention will now be described, by way of example only, with reference to the accompanying drawings, in which:

FIG. 2 illustrates an integrated circuit comprising electrostatic discharge protection circuitry according to a first exemplary embodiment of the invention.

Figure 3:
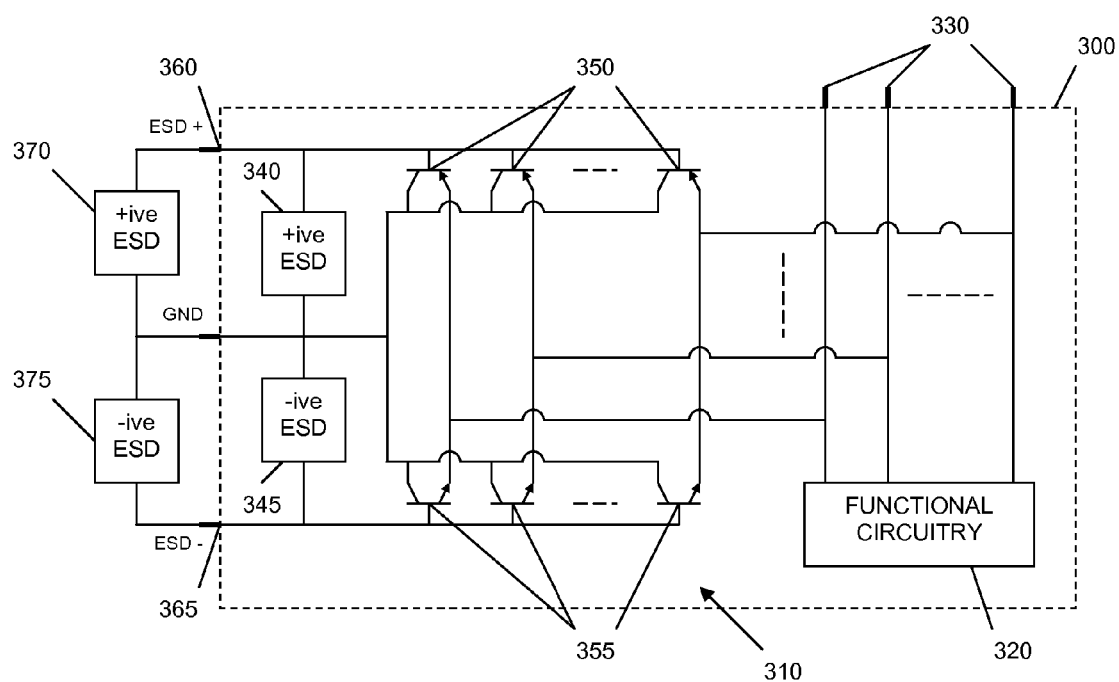

FIG. 3 illustrates an integrated circuit comprising electrostatic discharge protection circuitry according to a second exemplary embodiment of the invention.

Figure 4:
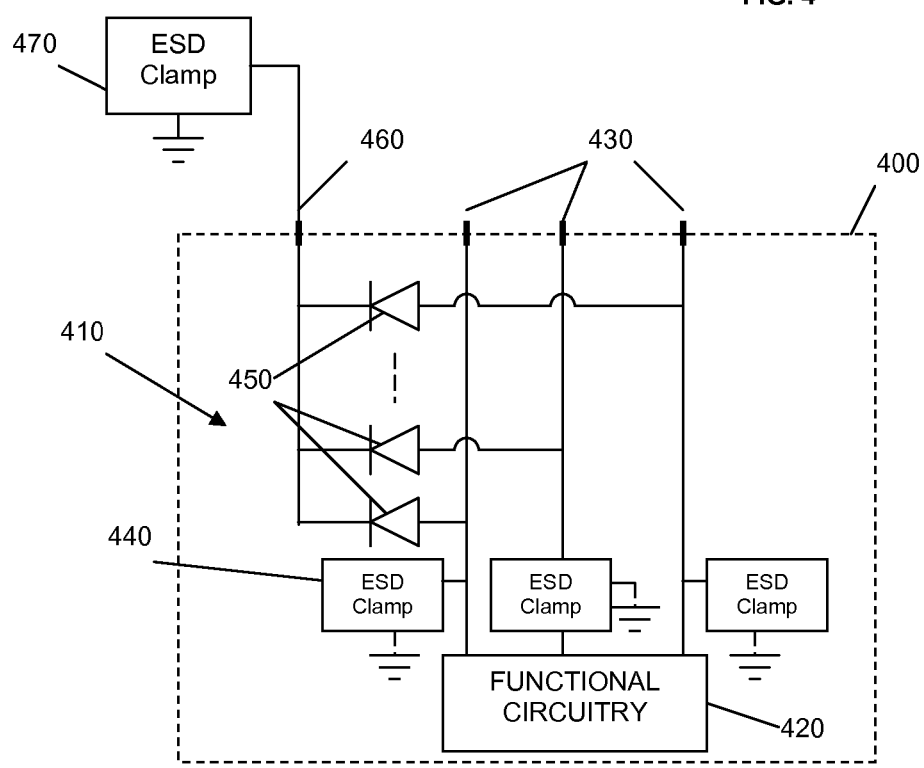

FIG. 4 illustrates an integrated circuit comprising electrostatic discharge protection circuitry according to a third exemplary embodiment of the invention.

DETAILED DESCRIPTION

Before describing in detail embodiments that are in accordance with the invention, it should be observed that the various apparatus components described herein, and as shown in the accompanying drawings, have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein. Thus, it will be appreciated that for simplicity and clarity of illustration, common and well-understood elements that are useful or necessary in a commercially feasible embodiment may not be depicted in order to facilitate a less obstructed view of these various embodiments.

Referring now to FIG. 2, there is illustrated an integrated circuit (IC) 200 comprising electro-static discharge (ESD) protection circuitry 210 according to a first exemplary embodiment of the invention. The IC 200 further comprises functional circuitry 200, providing at least some of the functionality for which the IC 200 is intended, and for which ESD protection is required. The functional circuitry 220 is coupled to a plurality of external connectors, for example pins 230.

As will be appreciated by a skilled artisan, the use of the term 'pins' herein, and in the claims, is not limiting, and may refer to any alternative form of connector. For example, in a case of IC packages comprising ball grid arrays, the connectors are in a form of balls of solder, or the like. For simplicity, the terms 'pin' and 'pins' are used herein to refer to connectors with which the IC is capable of establishing external electrical connections. Such electrical connections may be in a form of data connections, voltage supply connections, ground connections, etc. It will be understood that the use of such terms is not limiting, and may refer to any suitable form of connection.

Referring back to FIG. 2, the ESD protection circuitry 210 comprises an ESD protection component, which for the illustrated embodiment is in a form of an internal ESD clamp 240. The internal ESD clamp 240 is adapted to provide ESD protection to the functional circuitry 220, in particular to pins 230, and accordingly is coupled to pins 230 via isolation components, which for the illustrated embodiment are in a form of isolation diodes 250.

The ESD protection circuitry 210 is further coupled to an ESD pin 260, which in turn is coupled to an external ESD protection component, which for the illustrated embodiment is in a form of external ESD clamp 270. In this manner, supplementary ESD protection, in addition to that provided by the internal ESD clamp 240, is provided to the IC 200, and in particular to the functional circuitry 220 and pins 230. As illustrated, the ESD pin 260 is coupled to pins 230 via the isolation diodes 250. In this manner, the ESD pin 260, and thereby the external ESD protection component, is electrically isolated from the pins 230, and the pins 230 are isolated from each other by the isolation diodes 250 in series and back to back.

In accordance with this embodiment of the invention, the internal ESD clamp 240 is adapted to provide a relatively low level of ESD protection, for example protection against ESD events up to around 3 Amps. In this manner, the internal ESD component, e.g. the internal ESD clamp 240, is capable of providing ESD protection in accordance with standards such as: the Jedec standard JESD 22-A11D ESD Sensitivity Testing Human Body Model (HBM); and Jedec standard JESD22_C101C Field-Induced Charged-Device Model test Method for Electrostatic-Discharge-Withstand Thresholds of Microelectronic Components (CDM). In this manner, ESD protection is provided during manufacturing and testing processes.

Since the internal ESD component is only required to provide such a relatively low level of protection, the size and cost of the internal ESD component is not prohibitively high. Thus, the size and cost of the ESD circuitry 210 within the IC 200, and thereby the IC 200 itself, are kept low.

As previously mentioned, for analogue applications, and in particular for analogue applications requiring a high standard of reliability, ESD protection circuitry is required to provide protection against significantly higher ESD peak currents. Examples of such applications include, by way of example, automotive systems such as anti-lock brake systems (ABS), airbag deployment systems, electronic stabilisation program (ESP) systems, etc.

For such applications requiring a high standard of reliability, it is known for circuitry to be subjected to ESD gun testing, such as that defined in IEC6100042, ISO10605, etc. In such testing, an ESD is generated by a 'gun' and applied to pins of an IC under test. The ESD gun may be charged up to 25 kVolts prior to being discharged through a resistor of 330 Ohms. Thus, the current peak can reach 90 Amps, which is significantly higher than that of HBM and CDM testing.

Accordingly, supplementary ESD protection, which for the illustrated embodiment is in a form of the external ESD clamp 270, enables sufficient ESD protection to be provided to the IC 200, in order for the IC 200 to withstand such aggressive ESD events, without significantly impacting on the size and cost of the ESD protection circuitry 210 of the IC 200.

In particular, whilst the internal ESD component provides a low level of ESD protection, for example up to around 3 Amps, supplementary ESD protection may be provided via the ESD pin 260, enabling a high level of ESD protection as required, for example up to around 90 Amps in the case of ESD gun testing, as described above.

Furthermore, by providing a dedicated ESD connector, e.g. ESD pin 260, which is coupled to pins requiring ESD protection, e.g. pins 230, supplementary ESD protection is only required on a single pin. This is in contrast to known methods of providing ESD protection, in which ESD protection must be provided on each pin for which protection is required.

In this manner, the cost and footprint requirements for external ESD protection is reduced, in particular with regard to component count. Furthermore, since external ESD protection is only required to be provided to a single, dedicated pin, the provision of such external ESD protection is greatly simplified. In particular, by utilising external ESD protection in this manner, the electrical characteristics (e.g. clamping voltage, capacitance, etc.) can be adapted to suit the specific application for this the integrated circuit is to be used. In this manner, the electrical characteristics of the ESD protection can be adapted for different applications without affecting the internal components of the integrated circuit. Consequently, reliability of such ESD protection may be improved.

In addition, by utilising external ESD protection, metal traces between the external ESD clamp and ground are provided on, for example, a printed circuit board (PCB), as opposed to within an integrated circuit package, enabling traces comprising improved geometry aspect (width/length).

As will be appreciated by a skilled artisan, the level of protection afforded by the external ESD clamp 270 may be dependent upon a particular application for which the IC 200 is used. However, it is envisaged that the IC 200 may be designed and manufactured for a range of applications, and thus a range of ESD requirements, substantially independent of specific ESD requirements for specific applications. Specific ESD requirements may then be catered for by selection of a suitable external ESD component, whilst the internal ESD protection circuitry of the IC 200 provides sufficient ESD protection to the IC during manufacturing and testing.

The internal and external ESD protection components, which for the illustrated embodiment are in a form of ESD clamps 240, 270, may comprise any suitable ESD protection components. By way of example, such ESD components may comprise a capacitor and diode coupled in parallel to a ground plane. Alternatively, such ESD protection components may comprise transient suppressors or any switches able to absorb the ESD current in a way that the circuit stays in a safe electrical area.

Referring now to FIG. 3, there is illustrated an IC 300 comprising ESD protection circuitry 310 according to a second exemplary embodiment of the invention. The IC 300 further comprises functional circuitry 320, providing at least some of the functionality for which the IC 300 is intended, and for which ESD protection is required. The functional circuitry 320 is coupled to a plurality of external connectors, for example pins 330.

The ESD protection circuitry 310 comprises an internal positive ESD protection component 340 and an internal negative ESD protection component 345. The internal ESD protection components 340, 345 are adapted to provide ESD protection to the functional circuitry 320, in particular to pins 330, and accordingly are coupled to pins 330 via isolation components. In this manner, protection is afforded for both positive and negative ESD events, and in particular for low level ESD events, for example arising during manufacturing and testing procedures.

For the embodiment illustrated in FIG. 3, the isolation components, via which the internal positive ESD protection component 340 is coupled to pins 330, are in a form of PNP transistors 350. Conversely, the isolation components, via which the internal negative ESD protection component 345 is coupled to pins 330, are in a form of NPN transistors 355. Electrical isolation is ensured by the emitter/base junction in the case of the NPN transistor. In the case of PNP transistor the base/emitter junction forms the electrical isolation.

The ESD protection circuitry 310 is further coupled to a positive ESD pin 360, which in turn is coupled to an external ESD protection component 370. Furthermore, the ESD protection circuitry 310 is further coupled to a negative ESD pin 365, which in turn is coupled to an external negative ESD protection component 375. In this manner, supplementary ESD protection, in addition to that provided by the internal ESD components 340, 345, is provided to the IC 300, and in particular to the functional circuitry 320 and pins 330. In a similar manner to the embodiment illustrated in FIG. 2, the ESD pins 360, 365 are electrically isolated from pins 330 by transistors 350, 355.

In this manner, the IC 300 comprises a dedicated positive ESD pin 360 and a dedicated negative ESD pin 365. Further, the embodiment illustrated in FIG. 3 differs from the embodiment illustrated in FIG. 2 due to protection being provided separately for positive and negative ESD events. Nevertheless, the embodiment illustrated in FIG. 3 still provides the same advantages as that of FIG. 2, as will be appreciated by a skilled artisan.

For the various embodiment described hereinabove, and as illustrated in FIG. 2 and FIG. 3, the ESD protection circuitry comprises a signal internal ESD protection component. However, it will be appreciated by a skilled artisan that internal ESD protection circuitry may comprise a plurality of ESD protection components, each coupled to one or more pins.

Accordingly, and referring to FIG. 4, there is illustrated an IC 400 comprising ESD protection circuitry 410 according to a third exemplary embodiment of the invention. The IC 400 further comprises functional circuitry 420, providing at least some of the functionality for which the IC 400 is intended, and for which ESD protection is required. The functional circuitry 420 is coupled to a plurality of external connectors, for example pins 430.

The ESD protection circuitry 410 comprises a plurality of internal ESD protection components 440. The internal ESD protection components 440 are adapted to provide ESD protection to the functional circuitry 420, in particular to pins 430, and accordingly are coupled to pins 430.

In accordance with the third exemplary embodiment of the invention, pins 430 are coupled to an ESD pin 460, via isolation components, which for the illustrated embodiment are in a form of isolation diodes 450. The ESD pin 460 is coupled to an external ESD protection component, which for the illustrated embodiment is in a form of an external ESD clamp 470.

In this manner, the ESD protection circuitry comprise one or more ESD protection component(s) coupled to one or more external connector(s) for providing ESD protection thereto. The ESD protection circuitry further comprises an ESD connector, coupled to the one or more external connector(s) and arranged to couple supplementary ESD protection to the one or more external connector(s).

In particular, it will be understood that an electronic device, an integrated circuit, and the electro-static discharge protection circuitry therein, as described above, aim to provide at least one or more of the following advantages:

(i) Provision of integrated ESD protection during manufacturing and testing procedures;
(ii) A reduced cost and size for the IC;
(iii) A reduced silicon area required for ESD circuitry/components;
(iv) A reduced number of ESD components;

(v) An ability to vary ESD protection according to an application's requirements;
(vi) Provision of positive and negative ESD protection; and
(vii) Improved reliability.

In the foregoing specification, specific embodiments of the invention have been described. However, one of ordinary skill in the art appreciates that various modifications and changes can be made without departing from the scope of the invention, as set forth in the claims below. Accordingly, the specification and figures are to be regarded in an illustrative rather than a restrictive sense, and all such modifications are intended to be included within the scope of invention.

The benefits, advantages, solutions to problems, and any element(s) that may cause any benefit, advantage, or solution to occur or become more pronounced are not to be construed as critical, required, or essential features or elements of any or all of the claims.

In particular, it is envisaged that the aforementioned inventive concept can be applied by a semiconductor manufacturer to any integrated circuit architecture in which ESD protection is required.

It will be appreciated that any suitable distribution of functionality between different functional units, may be used without detracting from the inventive concept herein described. Hence, references to specific functional devices or elements are only to be seen as references to suitable means for providing the described functionality, further than indicative or a strict logical or physical structure or organization.

Aspects of the invention may be implemented in any suitable form including hardware, software, firmware or any combination of these. The elements and components of an embodiment of the invention may be physically, functionally and logically implemented in any suitable way. Indeed, the functionality may be implemented in a single unit or IC, in a plurality of units or ICs or as part of other functional units.

Although the invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognise that various features of the described embodiments may be combined in accordance with the invention. In the claims, the term 'comprising' does not exclude the presence of other elements or steps.

Furthermore, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, reference to 'a', 'an', 'first', 'second', etc do not preclude a plurality.

Thus, an integrated circuit and electronic device comprising ESD protection circuitry have been described, where the aforementioned disadvantages with prior art arrangements have been substantially alleviated.

The invention claimed is:

1. An integrated circuit comprising: electro-static discharge (ESD) protection circuitry arranged to provide ESD protection to one or more external connector(s) of the integrated circuit; the ESD protection circuitry comprises at least one ESD component coupled to the one or more external connector(s) for providing ESD protection thereto; and an external ESD connector coupled through isolation components to the one or more external connector(s), the external ESD connector arranged to couple supplementary ESD protection to the one or more external connector(s).

2. The integrated circuit of claim 1 wherein the isolation components comprise isolation diodes.

3. The integrated circuit of claim 2 wherein the ESD protection circuitry comprises at least one positive ESD protection component(s) and at least one negative ESD protection component(s), each coupled to one or more external connector(s) for providing ESD protection thereto.

4. The integrated circuit of claim 1 wherein the isolation components comprise transistors.

5. The integrated circuit of claim 4 wherein the ESD protection circuitry comprises at least one positive ESD protection component(s) and at least one negative ESD protection component(s), each coupled to one or more external connector(s) for providing ESD protection thereto.

6. The integrated circuit of claim 1 wherein the ESD protection circuitry comprises at least one positive ESD protection component(s) and at least one negative ESD protection component(s), each coupled to one or more external connector(s) for providing ESD protection thereto.

7. The integrated circuit of claim 6 wherein the ESD protection circuitry comprises a positive ESD connector coupled to the at least one positive ESD protection component(s) and a negative ESD connector coupled to at least one negative ESD protection component(s), each coupled to the one or more external connector(s) arranged to couple to supplementary positive and negative ESD protection to be provided to the external connectors respectively.

8. The integrated circuit of claim 7 wherein the positive ESD connector is coupled to the external connectors through one or more PNP transistors and the negative ESD connector is coupled to the one or more external connectors through one or more NPN transistors.

9. The integrated circuit of claim 1 wherein the at least one ESD component comprises a capacitor and a diode coupled in parallel to a ground plane.

10. The integrated circuit of claim 1 wherein the or each ESD component is adapted to provide a low level of ESD protection, in accordance with one of the following standards: the Jedec standard JESD 22- A11D ESD Sensitivity Testing Human Body Model (HBM); Jedec standard JESD22_C101C Field-Induced Charged-Device Model test Method for Electrostatic-Discharge-Withstand Thresholds of Microelectronic Components (CDM).

11. The integrated circuit of claim 1 wherein the ESD protection circuitry is adapted to provide a high level of supplementary ESD protection in accordance with at least one of the following standards IEC6100042 or ISO10605.

12. The integrated circuit of claim 1 wherein the ESD protection circuitry comprises at least one positive ESD protection component(s) and at least one negative ESD protection component(s), each coupled to one or more external connector(s) for providing ESD protection thereto.

13. The integrated circuit of claim 1 wherein the at least one ESD component comprises a capacitor and a diode coupled in parallel to a ground plane.

14. The integrated circuit of claim 1 wherein the supplementary ESD protection comprises an external ESD protection component coupled to the ESD connector.

15. The integrated circuit of claim 1 further comprising a first discharge path wherein the ESD protection circuitry is positioned between the external ESD connector and the ground plane of the integrated circuit, and a second discharge path wherein the isolation components are positioned between the external ESD connector and the one or more external connector(s).

16. An electronic device comprising: an integrated circuit, the integrated circuit comprising electro-static discharge (ESD) protection circuitry arranged to provide ESD protection to one or more external connector(s) of the integrated circuit; the ESD protection circuit comprises at least one ESD protection component(s) coupled to the one or more external connector(s) for providing ESD protection thereto; and an external ESD connector coupled through isolation components to the one or more external connector(s), the external ESD connector arranged to couple supplementary ESD protection to the one or more external connector(s).

17. The electronic device of claim 16 wherein the electronic device is applied to one of the following: (i) an anti-lock brake system (ABS); (ii) an airbag deployment system; (iii) an electronic stabilisation program (ESP).

18. An anti-lock brake system comprising an electronic device as claimed in claim 16.

19. An airbag deployment system comprising an electronic device as claimed in claim 16.

20. An electronic stabillisation program comprising an electronic device as claimed in claim 16.

\* \* \* \* \*